United States Patent [19]

Okada et al.

[11] Patent Number: 4,583,006

[45] Date of Patent: Apr. 15, 1986

[54] HIGH FREQUENCY OSCILLATION TYPE PROXIMITY SWITCH

[76] Inventors: Toshio Okada; Akira Kanzawa, both of 10-14, Hiroshibacho, Suita, Japan

[21] Appl. No.: 616,649

[22] Filed: Jun. 4, 1984

[30] Foreign Application Priority Data

Jun. 9, 1983 [JP] Japan ............................ 58-088053[U]
Jun. 29, 1983 [JP] Japan ............................ 58-151789[U]

[51] Int. Cl.⁴ ........................................... H01H 35/00
[52] U.S. Cl. .................................... 307/116; 361/180; 361/179
[58] Field of Search ....................... 307/116, 117, 139; 361/179–181, 142, 331, 395, 399; 336/90, 92, 96, 98; 174/52 R, 52 S, 52 DE

[56] References Cited

U.S. PATENT DOCUMENTS 4,271,763  6/1981  Berger ............................ 361/180 X
4,378,504  3/1983  Yamasaki ........................ 307/116 X
4,456,834  6/1984  Harris ................................ 307/91

Primary Examiner—G. P. Tolin
Assistant Examiner—T. DeBoer
Attorney, Agent, or Firm—Armstrong, Nikaido, Marmelstein & Kubovcik

[57] ABSTRACT

A high frequency oscillation type proximity switch, being an approach switch adapted for detecting the approach to or departure from the detector coil of a metal body, based on the change in output of the high frequency oscillator circuit, with the oscillator coil of the oscillator circuit as the detector coil, in which a small-diameter housing case is inserted in the cable interconnecting the detector head and the power source, the printed substrate for use as the signal detector circuit is provided in housing case and the housing case is filled with an insulation resin.

2 Claims, 6 Drawing Figures

HIGH FREQUENCY OSCILLATION TYPE PROXIMITY SWITCH

BACKGROUND OF THE INVENTION (1) Field of the Invention

The present invention relates to a proximity switch of the high frequency oscillation type and particularly pertains to an approach switch equipped with a signal detector circuit inserted in a cable connecting a detector head and a power source.

(2) Description of the Prior Art

Recently, high frequency oscillation type proximity switches are widely in use.

In the proximity switch of high frequency oscillation type, a signal detector circuit including a high frequency oscillator circuit, a detector circuit, a wave form shaping circuit, a comparator circuit, a reference voltage generator circuit, and an output circuit, etc., is used.

FIG. 1 shows a conventional proximity switch of the high frequency oscillation type, in which a detector head 2 having a coil 21 contained therein and a signal detector circuit 3 are interconnected through a cable 1. In this figure, reference numeral 31 denotes a power supply input line to the signal detector circuit and 32 is a signal line showing "ON" or "OFF" of the proximity switch.

In this proximity switch, the signal detector circuit 3 is housed in a relatively large boxy case. On this account, installing the case housing the signal detector circuit 3 in the vicinity of the detector head 2 will be objectonable because of increased spatial restriction in using the proximity switch. It is for this reason that the detector head 2 and the signal detector circuit 3 are normally installed apart from each other. Consequently, the cable 1 connecting the detector head 2 and the signal detector circuit 3 needs to be long, thus tending to be affected by noise. This separation of the signal detector circuit 3 and the detector head 2 from each other usually requires taking the trouble of connecting the signal detector circuit 3 and detector head 2 by wiring, every time this proximity switch is to be used.

FIG. 2 depicts a conventional proximity switch of the high frequency oscillator type which has been proposed and practically used for overcoming the above problem. The proximity switch in FIG. 2 is of a type having the signal detector circuit 3 provided within the detector head 2. Proximity switches of this type involve a disadvantage that the larger detector head is more likely to be subject to spatial restriction, although the inducement of noise and the troublesome wiring are averted.

SUMMARY OF THE INVENTION

The high frequency oscillation type proximity switch of this invention is characterized in that a small-diameter housing case is provided in the cable connecting the detector head and the power source, a printed substrate for a signal detector circuit is provided inside the housing case and the housing case is filled with an insulating resin.

This invention has as its object providing an proximity switch of the high frequency oscillation type which is less affected by noise.

Another object of this invention is to provide a proximity switch of the high frequency oscillation type which does not require taking trouble of connecting by wiring the detector head and the signal detector circuit proximity It is still the other object of this invention to provide an proximity switch which does not require larger-sized detector head.

DESCRIPTION OF THE PREFERRED EMBODIMENTS

Figure 1:
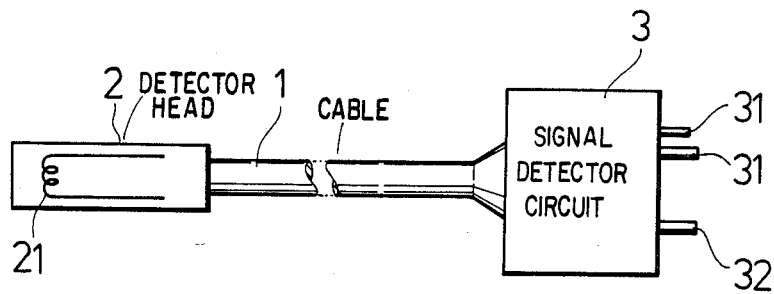
FIGS. 1 and 2 depict proximity switches of the high frequency oscillation type which have, heretofore, been in use.
Figure 2:
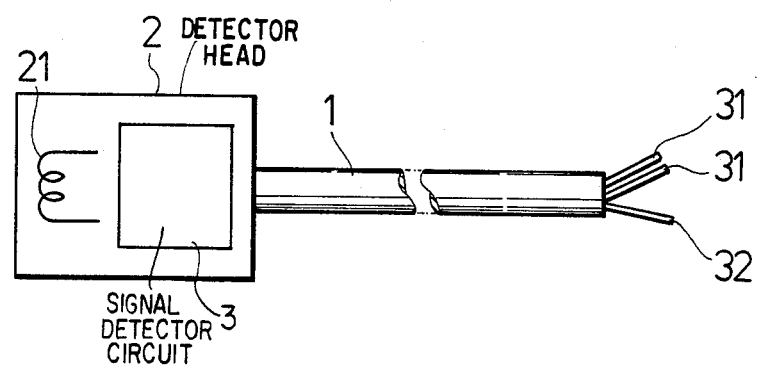
Figure 3:
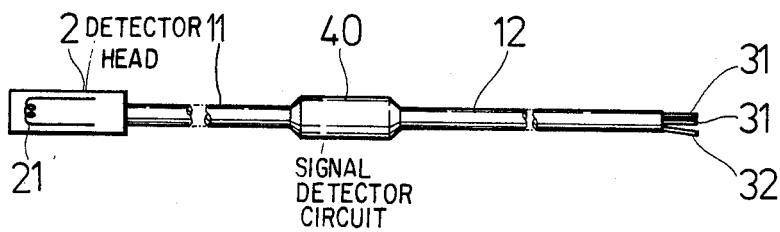
FIG. 3 is a external view of an proximity switch of the high frequency oscillation type according to this invention.

In FIG. 3, the parts shown in FIGS. 1 and 2 are represented by the same reference numerals. The cable is composed of the power side cable 12 and the detector head side cable 11. For prevention of inducement of noise, reduction of influence on the temperature characteristics of the cable and for the sake of expediency in making sure of the indications of the LED for confirmation of operation, which will be described later, it is desirable to use a shielded cable shortened to a suitable length for the detector head side cable 11. Between the cable 11 and the cable 12, a housing case 40 in which the printed circuit for use as the detector circuit is provided. The housing case 40 is so formed as to have a diameter which is, for example, less than twice the cable diameter.

Figure 4:
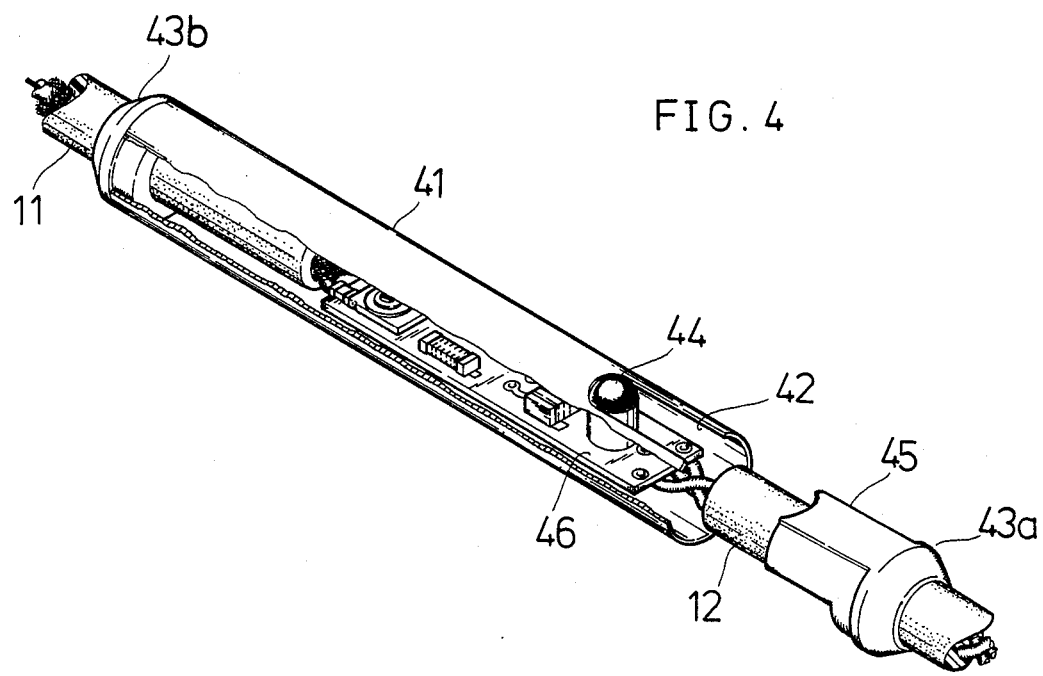
FIG. 4 is a partly broken perspective view of the housing case used in the proximity switch of high frequency oscillation type shown in FIG. 3.

In the following, the structure of the housing case 40 is described with reference to FIG. 4.

Numeral 41 designates a metal tube made of, for example, stainless steel tubing. At one end opening of the metal tube 41, a notch 42 a little wider than the diameter of the luminous part of LED 44 is formed. The terminal part of this notch 42 is of U-shape.

Numerals 43a and 43b represent frustoconical support members integrally formed of an insulating resin. The bottom parts of support members 43a and 43b are so stepped as to be inserted into the openings of the metal tube 41. In support members 43a and 43b, through-holes are formed in the axial direction and on the stepped part of the support member 43a, a lug 45 which is to be inserted into the notch 42 is formed, the tip of said lug having an arcuate concavity.

Numeral 46 denotes a rectangular substrate made of ceramic. On this substrate 46, not only the signal detector circuit is formed, but LED 44 for the indication of ON-OFF operation of the proximity switch is mounted. It should be noted that the substrate should desirably be electromagnetically shielded by winding therearound a shielding plate formed by laminating a copper foil with insulating sheets on opposite surfaces thereof.

Then the above-mentioned parts are installed in the following manner:

The substrate 46 is inserted into the metal tube 41 in such way that the luminous part of LED 44 projects out of the housing case at the terminal part of the notch 42 and the support member 43b sleeved on the cable 11 is fitted into the metal tube 41. Thereafter, in order to increase the mechanical strength of the substrate 46, an insulating resin is poured in through the one end opening of the metal tube 41. Then, by fitting the support member 43a into said opening, LED 44 is held between the bottom of the notch 42 and the tip of the lug 45 of the support member 43a. In this way, the mounting of LED 44 is facilitated. Besides, the luminous part of LED 44 projecting from the surface of the metal tube 41 to be clearly visible from any direction enables the operator to be certain of the LED's activation.

Figure 5:
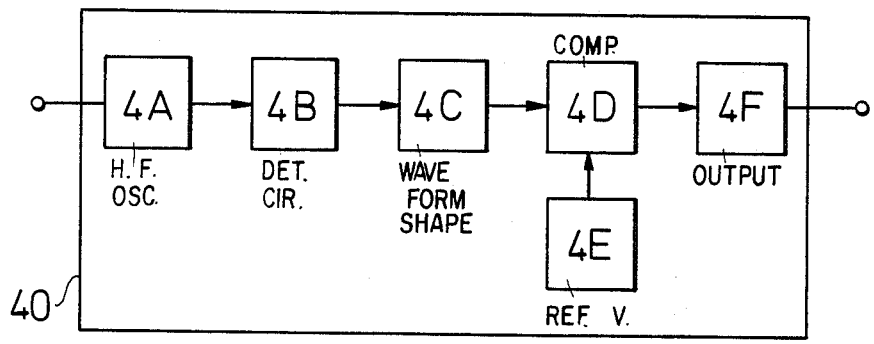
FIG. 5 is a block diagram schematically showing the detector circuit used in the proximity switch of high frequency oscillation type of this invention.

In the following, the signal detector circuit used in this invention is described with reference to FIG. 5. The structure of this signal detector circuit itself is well-known. Thus the signal detector circuit is composed of a high frequency oscillator circuit 4A, a detector circuit 4B, a wave form shaping circuit 4C, a comparator circuit 4D, a reference voltage circuit 4E and an output circuit 4F. The coil 21 is excited by the high frequency oscillator circuit 4A, so that as a result of generation of eddgy current due to approaching metal, the coil's impedance undergoes a change. The change in signal based on such a variation in impedance is extracted through the detector circuit 4B and the wave form shaper circuit 4C. Then the signal is inputted into the comparator circuit 4D, to be compared with the reference voltage supplied from the reference voltage circuit 4E, and the result is taken out of the output circuit 4F.

Figure 6:
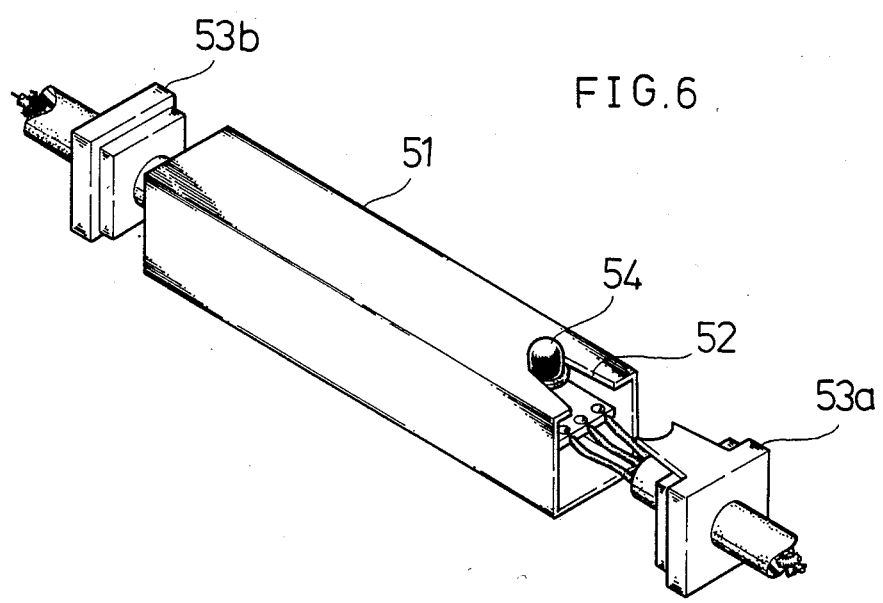
FIG. 6 is a drawing illustrating another housing case employed in the proximity switch of high frequency oscillation type of this invention.

It should be noted that in the embodiment of this invention, a housing case of a cylindrical metal tube is taken as an example, but this invention is not restricted to use of such a tube. For example, as shown in FIG. 6, at one end opening of a square metal tube 51, a V-shape notch 52 with arcuate bottom is formed and on one of the support members 53a and 53b which are fitted into the metal tube 51 is formed with a lug for engagement with the LED 54 projecting at the bottom part of the notch 52 to hold it therebetween. Similar effect as in the this embodiment may be achieved by installing the printed substrate for use as the signal detector circuit in such a housing case.

Since the proximity switch of the high frequency oscillation type of this invention has its signal detector circuit in a small-diameter housing case, this housing case may be located in proximity to the detector head. It is, therefor, possible to shorten the cable connected to the detector head, thus realizing the effect of reducing induced noise Furthermore, since the housing case is preliminarily integrated with the detector head by connecting it therewith by a cable, there is no need of taking the trouble of making the connection above-mentioned when using the proximity switch.

Further still, since the proximity switch of high frequency oscillation type of this invention does not have its signal detector circuit provided in the detector head, the detector head remains small in size.

What is claimed is:

1. In a high frequency oscillation proximity switch comprising a detector head and a signal detector circuit, said signal detector circuit being contained in a small diameter housing case connected at one end by a first cable to said detector head and at the other end by a second cable to a power source, the improvement comprising:

said housing case being formed with a tubular peripheral wall having an opening at each end thereof;

a printed substrate carrying said signal detector circuit positioned in said housing case;

a first support member fitting around said first cable and fitting into one end opening of said housing case;

a second support member fitting around said second cable and fitting into the other end opening of said housing case;

said housing case being formed with a notch in said peripheral wall extending longitudinally into said wall from one open end thereof;

a light emitting diode for indicating the ON-OFF operating condition of said proximity switch mounted on said printed substrate, said light emitting diode having a luminous part projecting through said housing case at said notch; and said support member at said notched end of said housing case being formed, at the end fitting into said housing case opening, with a lug fitting into said notch to lock said light emitting diode therein, whereby said light emitting diode is mounted in said housing case with its luminous part extending out therefrom to be clearly visible from any direction.

2. The improvement in a high frequency oscillation proximity switch is recited in claim 1 wherein the termianl part of said notch is of U-shape and said lug has a tip formed with an arcuate concavity, whereby said light emitting diode is fixedly held in said notch between said U-shaped terminal portion of said notch and said arcuate concavity of said lug.

* * * * *